US012646442B2

(12) United States Patent
Hu et al.

(10) Patent No.: US 12,646,442 B2
(45) Date of Patent: Jun. 2, 2026

(54) DISPLAY SUBSTRATE AND DRIVING METHOD THEREFOR, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yao Hu, Beijing (CN); Ruoxiang Li, Beijing (CN); Qian Chen, Beijing (CN); Feifan Wang, Beijing (CN); Guangshun Luo, Beijing (CN); Kuo Sun, Beijing (CN); Qifu Ran, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 109 days.

(21) Appl. No.: 18/556,760

(22) PCT Filed: Oct. 25, 2021

(86) PCT No.: PCT/CN2021/125988
§ 371 (c)(1),
(2) Date: Oct. 23, 2023

(87) PCT Pub. No.: WO2022/227441
PCT Pub. Date: Nov. 3, 2022

(65) Prior Publication Data
US 2025/0095544 A1 Mar. 20, 2025

(30) Foreign Application Priority Data
Apr. 28, 2021 (CN) .......................... 202110464616.4

(51) Int. Cl.
G09G 3/32 (2016.01)
H10H 29/24 (2026.01)
(Continued)

(52) U.S. Cl.
CPC ............... *G09G 3/32* (2013.01); *H10H 29/24* (2025.01); *H10H 29/34* (2025.01); *H10H 29/49* (2025.01);
(Continued)

(58) Field of Classification Search
CPC ...... G09G 3/32; G09G 2360/144; G09G 3/20; H10H 29/24; H10H 29/34; H10H 29/49;
(Continued)

(56) References Cited

U.S. PATENT DOCUMENTS

2013/0278576 A1 10/2013 Lee et al.
2014/0132158 A1* 5/2014 Land ........................ G09G 3/20
315/149

(Continued)

FOREIGN PATENT DOCUMENTS

CN 110071164 A 7/2019
CN 110164847 A 8/2019
(Continued)

OTHER PUBLICATIONS

CN202110464616.4 first office action.
(Continued)

*Primary Examiner* — Temesghen Ghebretinsae
*Assistant Examiner* — Ivelisse Martinez Quiles
(74) *Attorney, Agent, or Firm* — IPro, PLLC

(57) ABSTRACT

Disclosed are a display substrate, driving method and a display device. The display substrate includes: a substrate base including a first display area and a second display area; the plurality of light-emitting devices include a plurality of first light-emitting devices in the first display area and a
(Continued)

plurality of second light-emitting devices in the second display area, and the density of the plurality of first light-emitting devices in the first display area is less than or equal to that of the plurality of second light-emitting devices in the second display area; and the plurality of ambient sensors are in the first display area and below at least part of the first light-emitting devices, and the orthographic projections of the ambient sensor on the substrate base covers and is greater than the orthographic projections of the corresponding first light-emitting devices on the substrate base.

19 Claims, 10 Drawing Sheets

(51) Int. Cl.

| | | |
|---|---|---|
| *H10H 29/34* | (2025.01) | |
| *H10H 29/49* | (2025.01) | |
| *H10H 29/80* | (2025.01) | |
| *H10H 29/85* | (2025.01) | |

(52) U.S. Cl.
CPC .... *H10H 29/8323* (2025.01); *H10H 29/8517* (2025.01); *G09G 2360/144* (2013.01)

(58) Field of Classification Search
CPC .......... H10H 29/8323; H10H 29/8517; H10H 29/142; H10K 59/60; H10K 59/12; H10K 59/65
See application file for complete search history.

(56) References Cited

U.S. PATENT DOCUMENTS

| | | | | |
|---|---|---|---|---|
| 2019/0025971 | A1* | 1/2019 | Li | ......................... H10K 59/131 |
| 2020/0111851 | A1* | 4/2020 | Park | ....................... H10K 39/32 |
| 2020/0381492 | A1* | 12/2020 | Ryu | .................. H10K 59/8792 |
| 2021/0074777 | A1 | 3/2021 | Chen | |
| 2021/0124897 | A1* | 4/2021 | Liu | ....................... H10K 50/844 |
| 2021/0233972 | A1* | 7/2021 | Liu | ......................... H10K 59/60 |
| 2022/0036808 | A1* | 2/2022 | Wu | ........................ G09G 3/3233 |
| 2022/0093682 | A1* | 3/2022 | Chang | ................. H10K 59/131 |
| 2022/0285460 | A1* | 9/2022 | Kim | ....................... H10K 59/60 |
| 2022/0302224 | A1* | 9/2022 | Wu | ........................ H10K 59/60 |
| 2023/0345794 | A1* | 10/2023 | Hai | ........................ H10K 65/00 |

FOREIGN PATENT DOCUMENTS

| | | | | | |
|---|---|---|---|---|---|
| CN | 210515985 | U | * | 5/2020 | .......... G06F 1/1637 |
| CN | 112490266 | A | | 3/2021 | |
| CN | 113161407 | A | | 7/2021 | |

OTHER PUBLICATIONS

CN202110464616.4 second office action.
CN202110464616.4 third office action.
CN202110464616.4 Decision of Rejection.
PCT/CN2021/125988 international search report.

\* cited by examiner

A        B 106    107

DISPLAY SUBSTRATE AND DRIVING METHOD THEREFOR, AND DISPLAY DEVICE

CROSS REFERENCE TO RELATED APPLICATION

The present disclosure is a National Stage of International Application No. PCT/CN2021/125988, filed Oct. 25, 2021, which claims the priority of Chinese patent application No. 202110464616.4, filed with the China National Intellectual Property Administration on Apr. 28, 2021 and entitled "Display Substrate and Driving Method Therefor, and Display Device". The entire contents of which are incorporated herein by reference.

TECHNICAL FIELD

The present disclosure relates to the field of display technology, and in particular to a display substrate and driving method therefor, and display device.

BACKGROUND

With the rapid development of smart phones, not only the appearance of the mobile phone is required to be beautiful, but also a better visual experience for the users of the mobile phone may be taken into account. The manufacturers have begun to increase the screen-to-body ratio on the smart phones, making a full screen be a new competition point for the smart phones.

SUMMARY

Embodiments of the present disclosure provide a display substrate, a driving method therefor, and a display device, and the specific solutions are as follows.

In a first aspect, a display substrate is provided by an embodiment of the present disclosure. The display substrate includes: a base substrate, including a first display area and a second display area located at least on one side of the first display area, where the first display area is configured to install a camera module; a plurality of light-emitting devices, arranged in an array on the base substrate, where the plurality of light-emitting devices include: a plurality of first light-emitting devices in the first display area, and a plurality of second light-emitting devices in the second display area, and a density of the plurality of first light-emitting devices in the first display area is less than or equal to a density of the plurality of second light-emitting devices in the second display area; and a plurality of ambient sensors, arranged between a layer where the plurality of light-emitting devices are located and the base substrate, where the plurality of ambient sensors are in the first display area, and the plurality of ambient sensors are below at least part of the first light-emitting device, and an orthographic projection of the ambient sensor on the base substrate covers and is larger than an orthographic projection of a corresponding first light-emitting device on the base substrate.

In some embodiments, a distance, between a boundary of the orthographic projection of the ambient sensor on the base substrate and a boundary of the orthographic projection of the corresponding first light-emitting device on the base substrate, ranges from 2 μm to 3 μm.

In some embodiments, the display substrate further includes: a color filter layer, arranged on a side, facing away from the base substrate, of the layer where the plurality of light-emitting devices are located; where the color filter layer comprises a plurality of color resists, each of the color resists and one ambient sensor are arranged correspondingly, and a light-transmitting color of the color resist is the same as a light-emitting color of the first light-emitting device above a corresponding ambient sensor.

In some embodiments, an orthographic projection of the color resist on the base substrate approximately coincides with an orthographic projection of the corresponding ambient sensor on the base substrate.

In some embodiments, at least one row of the first light-emitting device is spaced between adjacent two rows of the ambient sensors, and at least one column of the first light-emitting device is spaced between adjacent two columns of the ambient sensors.

In some embodiments, light-emitting colors of the first light-emitting devices in a same row are same, and light-emitting colors of the first light-emitting devices in adjacent rows are different.

In some embodiments, each of the ambient sensors includes a first transparent electrode and a second transparent electrode, and a layer where the first transparent electrode is located is between a layer where the second transparent electrode is located and the base substrate; and the first transparent electrodes of the ambient sensors in a same row are electrically connected, and the second transparent electrodes of the ambient sensors in at least one row are electrically connected.

In some embodiments, the display substrate further includes: a high-level signal line and an adaptor portion, where the adaptor portion is arranged in a same layer and material as the first transparent electrode, and a layer where the high-level signal line is located is between the layer where the first transparent electrode is located and the base substrate; and the high-level signal line is electrically connected with the second transparent electrode through the adaptor portion, a number of the adaptor portions is equal to a number of the high-level signal lines, and the second transparent electrodes of at least one row of the ambient sensors are electrically connected with one of the adaptor portions.

In some embodiments, the second transparent electrodes of ambient sensor in a same row are electrically connected with one of the adaptor portions; and the number of the high-level signal lines is same as the number of the adaptor portions, which is equal to a total number of rows of the ambient sensors.

In some embodiments, the second transparent electrodes of all the ambient sensors are electrically connected with a same adaptor portion, and the number of high-level signal lines and the number of the adaptor portions each are equal to 1.

In some embodiments, the display substrate further includes: a plurality of first switch transistors, a plurality of field effect transistors, a low-level signal line and a plurality of first control signal lines; a gate of each of the first switch transistors is electrically connected with one of the first control signal lines, and a gate of the field effect transistor is configured to be loaded with a fixed voltage; and two of the first switch transistors and two of the field effect transistors are arranged between the ambient sensor in the $i^{th}$ column and the ambient sensor in the $(i+1)^{th}$ column, and the two first switch transistor are connected in series between the first transparent electrode of the ambient sensor in the $i^{th}$ column and the first transparent electrode of the ambient sensor in the $(i+1)^{th}$ column, one of the two field effect transistors is connected in series between the first transparent electrode of the ambient sensor in the $i^{th}$ column and the low-level signal line, and the other of the two field effect transistors is connected in series between the first transparent electrode of the ambient sensor in the $(i+1)^{th}$ column and the low-level signal line, wherein i is an integer greater than or equal to 1 and less than m, and m is a total number of columns of the ambient sensors.

In some embodiments, the display substrate further includes: a plurality of second switch transistors and a plurality of second control signal lines; a gate of each of the second switch transistors is electrically connected with one of the second control signal lines, and each of the second switch transistors is connected in series between the high-level signal line and a row of the ambient sensors.

In some embodiments, the ambient sensor further includes a P-type semiconductor layer and an N-type semiconductor layer arranged in stacked, or the ambient sensor further includes: a P-type semiconductor layer, an intrinsic semiconductor layer, and an N-type semiconductor layer arranged in stacked; the N-type semiconductor layer is electrically connected with the first transparent electrode, and the P-type semiconductor layer is electrically connected with the second transparent electrode; and the low-level signal line is in the same layer as the P-type semiconductor layer, and the material of the low-level signal line is the material of the conductive P-type semiconductor layer.

In some embodiments, the first control signal line and the second control signal line are in the same layer and the same material as the gate of the first switch transistor and the gate of the second switch transistor; and the high-level signal line is in the same layer as the source and drain of the first switch transistor and the source and drain of the second switching transistor, and the material of the high-level signal line is aluminum alloy or molybdenum metal, and the materials of the source and drain of the first switch transistor and the source and drain of the second switch transistor include a first titanium metal layer, an aluminum metal layer and a second titanium metal layer arranged in stacked.

In some embodiments, the display substrate further includes: a border area adjacent to the first display area, where the plurality of first switch transistors, the plurality of first control signal lines, the plurality of second switch transistors, the plurality of field effect transistors, the low-level signal line and the plurality of second control signal lines are located in the border area.

In some embodiments, each of the ambient sensors further includes: a connection portion arranged below the N-type semiconductor layer, and adjacent first transparent electrodes of the ambient sensors in a same column are electrically connected through the connection portion.

In some embodiments, the connection portion is in the same layer as the source and drain of the first switch transistor and the source and drain of the second switch transistor, and a material of the connection portion is aluminum alloy or molybdenum metal.

In some embodiments, the display substrate further includes: a plurality of transparent wirings between the base substrate and a layer where the plurality of light-emitting devices are located, and a plurality of pixel driving circuits between the base substrate and a layer where a plurality of transparent wirings are located; where the plurality of transparent wirings are connected between the plurality of pixel driving circuits and the plurality of first light-emitting devices, and the plurality of transparent wirings are arranged in a same layer as the first transparent electrode and/or the second transparent electrode.

In a second aspect, an embodiment of the present disclosure provides a display device including the above-mentioned display substrate.

In a third aspect, an embodiment of the present disclosure provides a method for driving the above-mentioned display substrate, including: in a non-light-emitting stage, detecting ambient light brightness by the ambient sensor; automatically adjusting screen brightness according to the detected ambient light brightness and a preset function relationship between ambient light brightness and screen brightness; and in a light-emitting stage, diving a light-emitting device to emit light for screen display.

In some embodiments, in the non-light-emitting stage, before detecting the brightness of the ambient light by the ambient sensor, the method further includes: controlling at least one second switch transistor to be in an on state through a second control signal line, and controlling the other second switch transistors to be in an off state; where light-emitting colors of the first light-emitting devices corresponding to each row of ambient sensors electrically connected with the second switch transistors in the on state are the same color.

In some embodiments, the ambient light brightness is detected by the ambient sensor, In some embodiments including: controlling two first switch transistors between the ambient sensor in the $i^{th}$ column and the ambient sensor in the $(i+1)^{th}$ column to be in an on state through the first control signal line, and controlling the remaining first switch transistors to be in an off state, loading a low-level signal on the low-level signal line, and loading a fixed voltage on gates of two field effect transistors MOS between the ambient sensor in the $i^{th}$ column and the ambient sensor in the $(i+1)^{th}$ column at the same time, to read electrical signals between the ambient sensor in the $i^{th}$ column and the ambient sensor in the $(i+1)^{th}$ column by time-sharing; and comparing the multiple electrical signals read by time-sharing, eliminating the electrical signal with large fluctuations, and determining an average value of the electrical signals of the ambient sensors in each column according to the remaining electrical signals and the pre-stored electrical signals of the ambient sensor in the first column or the ambient sensor in the $m^{th}$ column, wherein the average value of the electrical signals of the ambient sensors in each column is the detected ambient light brightness.

DETAILED DESCRIPTION

Figure 1:
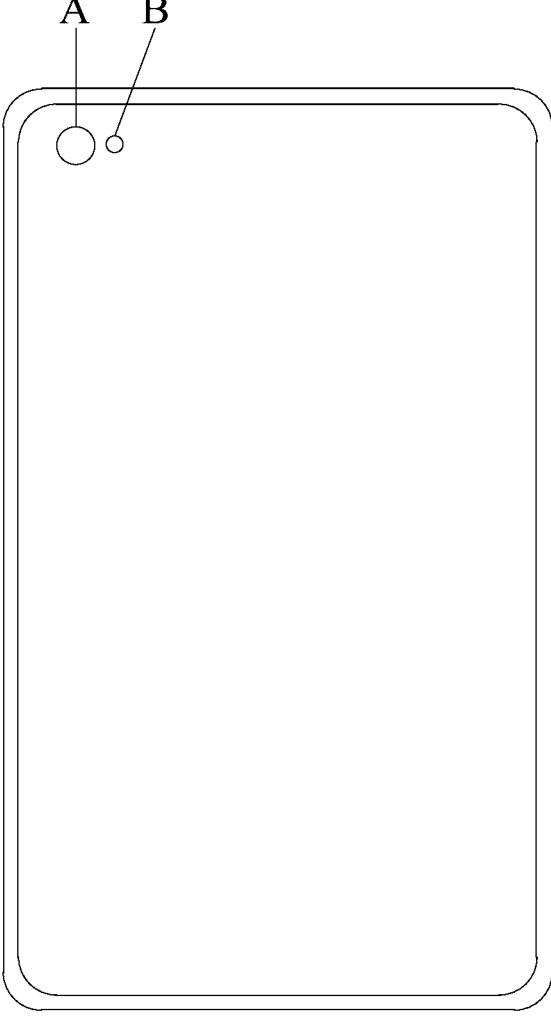
FIG. 1 is a schematic structural diagram of a display device in the related art.

In order to make the purpose, technical solutions and advantages of embodiments of the present disclosure clearer, the technical solutions of embodiments of the present disclosure will be clearly and completely described below with reference to the accompanying drawings of embodiments of the present disclosure. It should be noted that the dimensions and shapes of the figures in the accompanying drawings do not reflect the actual scale, and are only intended to illustrate the content of the present disclosure. And the same or similar reference numerals refer to the same or similar elements or elements having the same or similar functions throughout.

Unless otherwise defined, technical or scientific terms used herein should have the ordinary meaning as understood by one of ordinary skill in the art to which the present disclosure belongs. The terms "first", "second" and the like used in the description and claims of the present disclosure do not denote any order, quantity or importance, but are only used to distinguish different components. "Comprise" or "include" and similar words mean that the elements or things appearing before the word encompass the elements or things recited after the word and their equivalents, but do not exclude other elements or things. "Inner", "outer", "upper", "lower", etc. are only used to indicate the relative positional relationship, and when the absolute position of the described object changes, the relative positional relationship may also change accordingly.

As users have higher and higher demands for the screen-to-body ratio of display devices, more and more functional devices need to be integrated into the screen. Related products already have a technical solution of integrating a camera and an ambient sensor in the display area. In some embodiments, as shown in FIG. 1, the display resolution of the camera area A in FIG. 1 is low, so that the transmittance of the camera area A is high, so as to ensure the camera effect; in FIG. 1, the ambient sensor area B has a separate hole, so that the ambient sensor can effectively discriminate the brightness of the ambient light to adjust the screen brightness according to the brightness of the ambient light, which can save power and improve the visual effect. However, the ambient sensor area B has a separate hole, which is not conducive to improving the screen-to-body ratio.

In order to solve at least the above technical problems existing in the related art, embodiments of the present disclosure provide a display substrate, as shown in FIG. 2 to FIG. 5. The display substrate includes: a base substrate 101, including a first display area AA1 and a second display area AA2 located at least on one side of the first display area AA1, and the first display area AA1 being configured to install a camera module; a plurality of light-emitting devices, arranged in an array on the base substrate 101, where the plurality of light-emitting devices include: a plurality of first light-emitting devices 102 located in the first display area AA1, and a plurality of second light-emitting devices (not shown in the figure) located in the second display area AA2, and a density of the plurality of first light-emitting devices 102 in the first display area AA1 is less than or equal to a density of the plurality of second light-emitting devices in the second display area AA2; and a plurality of ambient sensors 103, arranged between layers where the plurality of first light-emitting devices 102 are located and the base substrate 101, where the plurality of ambient sensors 103 are arranged in the first display area AA1, and the plurality of ambient sensors 103 are located below at least part of the first light-emitting devices 102, and an orthographic projection of the ambient sensor 103 on the base substrate 101 covers and is larger than an orthographic projection of a corresponding first light-emitting device 102 on the base substrate 101.

In the above-mentioned display substrate provided by embodiments of the present disclosure, by integrating the ambient sensor 103 in the first display area AA1 where the camera module is located, there is no need to separately open a hole to set the ambient sensor 103, therefore, it is beneficial to further improve the screen-to-body ratio. In addition, the ambient sensor 103 is arranged below the first light-emitting device 102, so that the ambient sensor 103 will not block the outgoing light of the first light-emitting device 102. Further, since the orthographic projection of the ambient sensor 103 is larger than the orthographic projection of the first light-emitting device 102, which ensures that the ambient sensor 103 can receive ambient light through an area other than the first light-emitting device 102, so as to adjust the screen brightness according to the brightness of the ambient light.

In some embodiments, in the above-mentioned display substrate provided by embodiments of the present disclosure, in order to take into account the brightness adjustment effect of the ambient sensor 103 and the imaging effect of the camera module, a distance, between the boundary of the orthographic projection of the ambient sensor 103 on the base substrate 101 and the boundary of the orthographic projection of the corresponding first light-emitting device 102 on the base substrate 101, may range from 2 μm to 3 μm.

Figure 3:
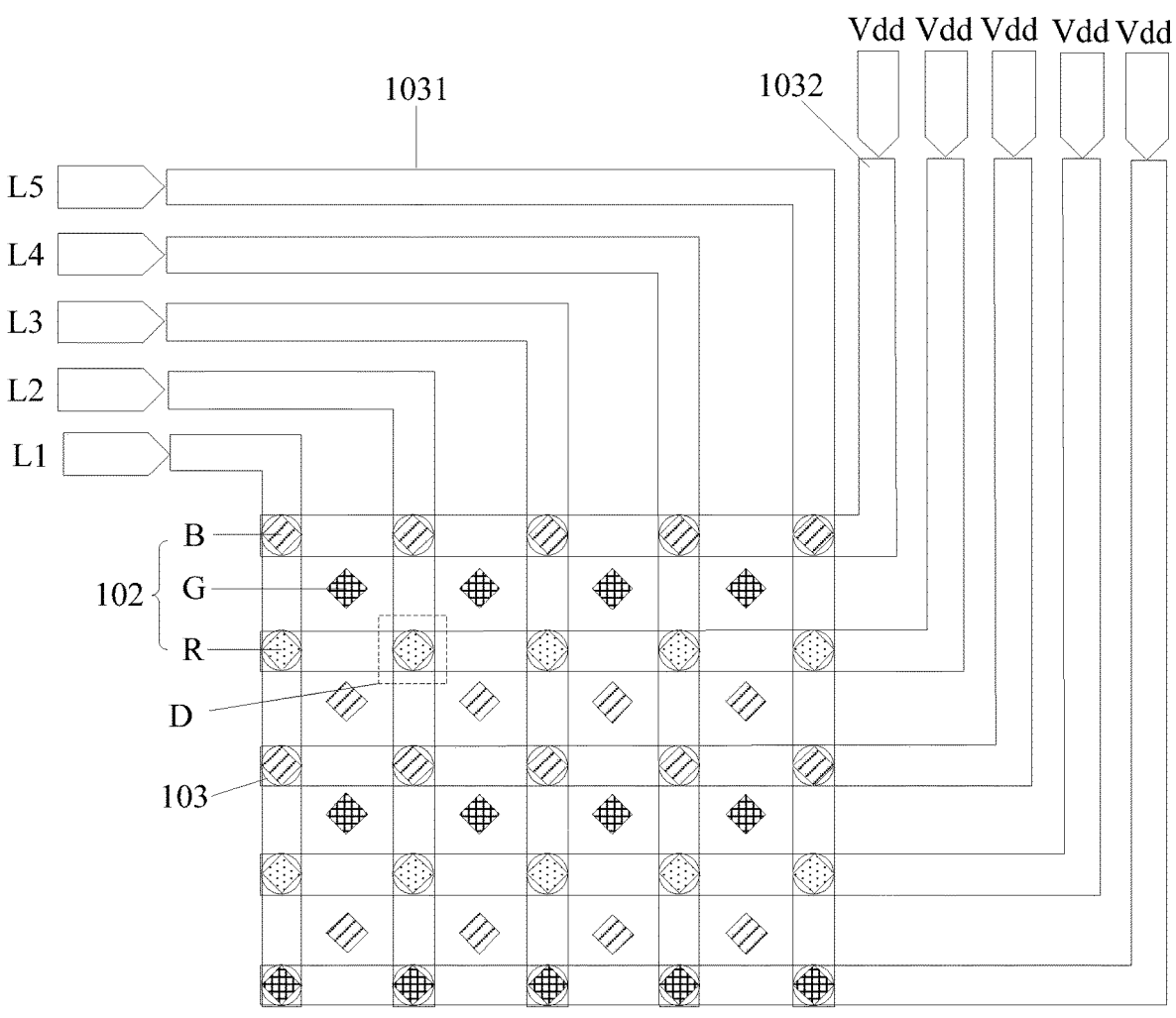
FIG. 3 is an enlarged structure schematic diagram of an area AA1 in FIG. 2.
Figure 4:
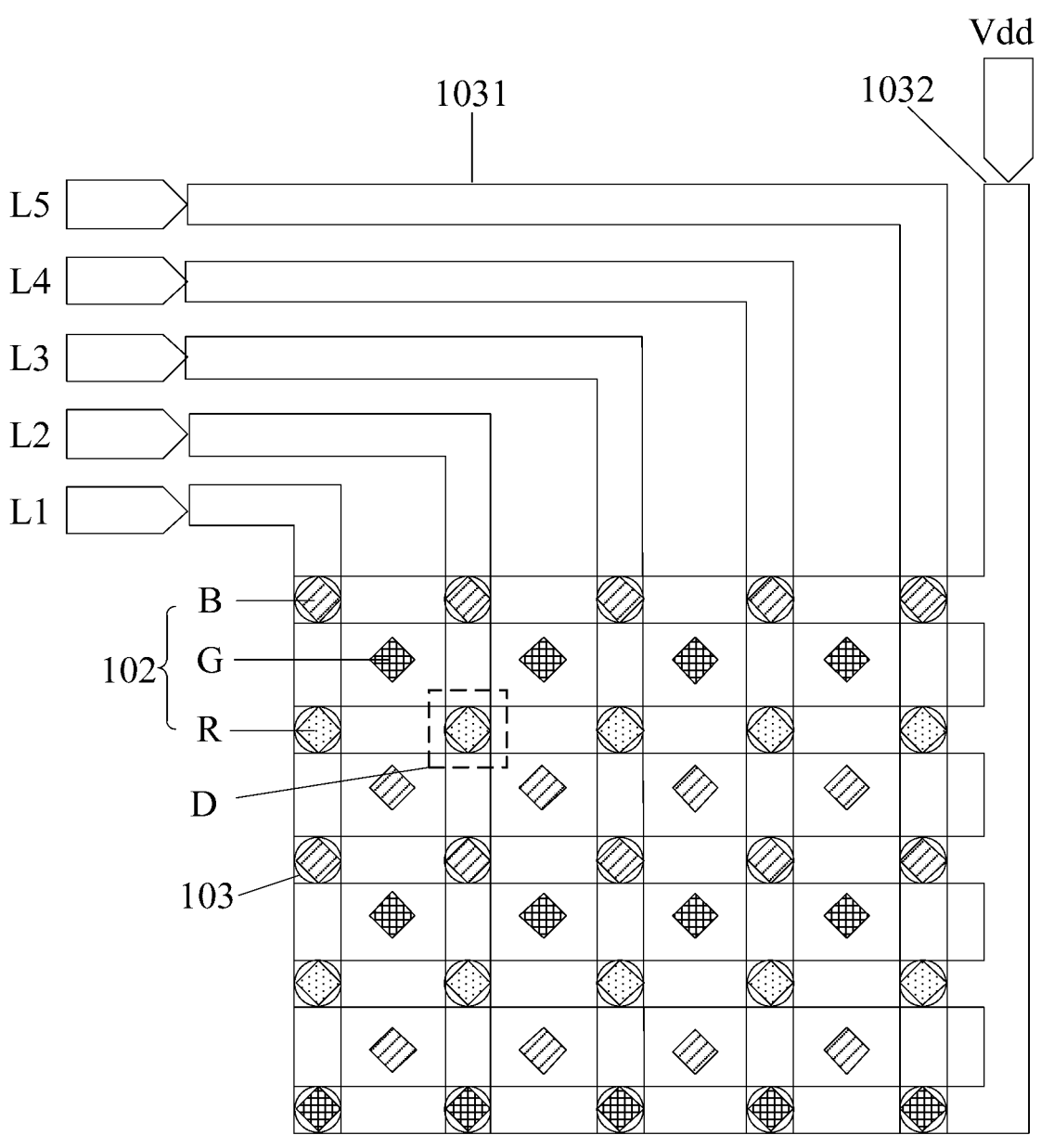
FIG. 4 is another enlarged structure schematic diagram of an area AA1 in FIG. 2.
Figure 6:
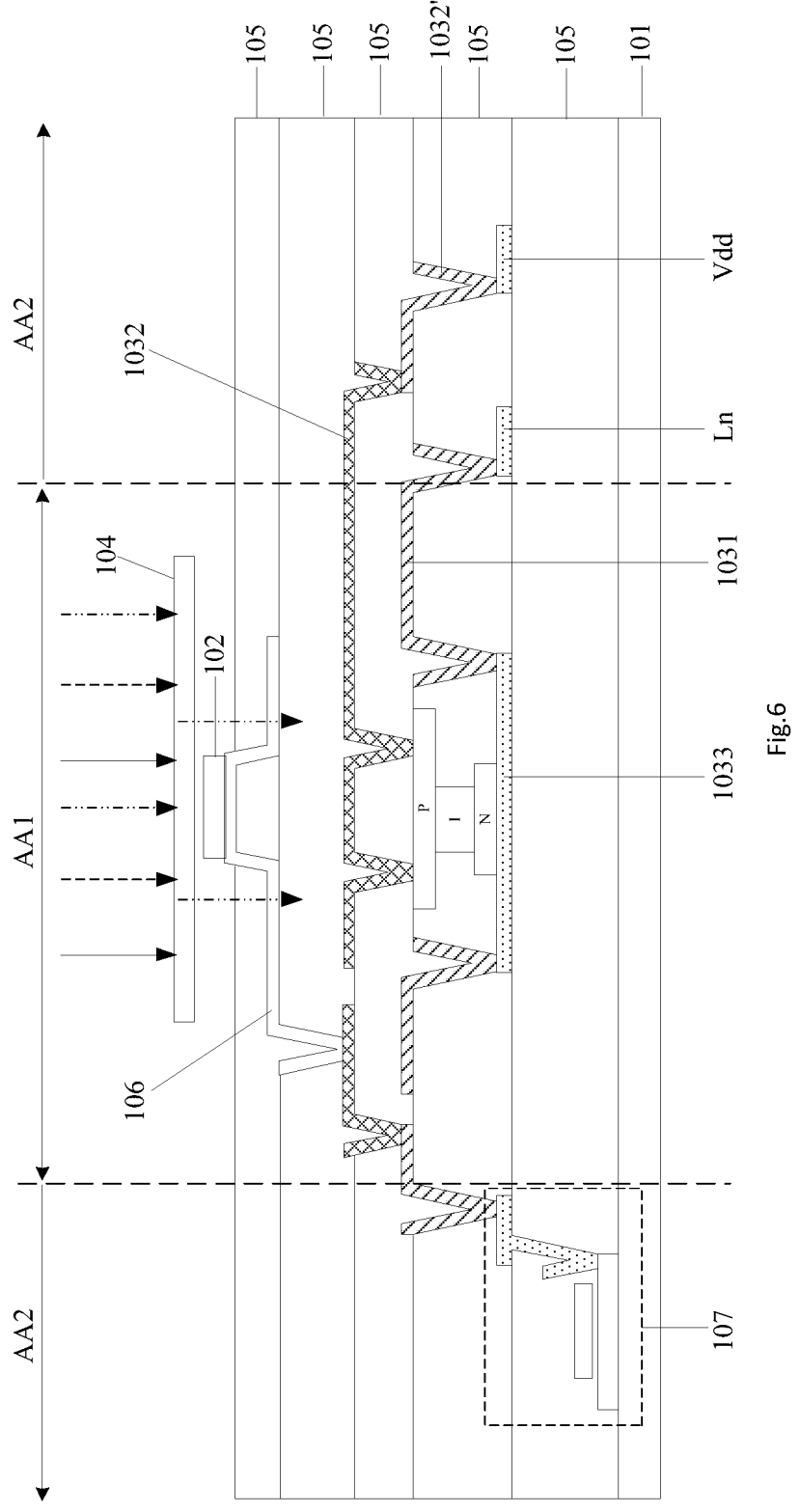
FIG. 6 is another sectional structure schematic diagram of an area D in FIG. 3 and FIG. 4.

In some embodiments, in the above-mentioned display substrate provided by the embodiments of the present disclosure, as shown in FIG. 3, FIG. 4, and FIG. 6, the display substrate may further include: a color filter layer 104 arranged on a side, facing away from the base substrate 101, of a layer where the plurality of light-emitting devices are located (i.e., a layer where the first light-emitting devices 102 are located); the color filter layer 104 includes a plurality of color resists (such as red color resists, green color resists and blue color resists), each color resist and one ambient sensor 103 are correspondingly arranged, and the light-transmitting color of the color resist is the same as the light-emitting color of the first light-emitting device 102 above the corresponding ambient sensor 103. Exemplarily, the first light-emitting device 102 under the red color resist is a red light device R, the first light-emitting device 102 under the green color resist is a green light device G, and the first light-emitting device 102 under the blue color resist is a blue light device B.

The ambient sensor 103 in the related art only supports perception of light intensity, and cannot identify ambient light of different colors. In the present disclosure, by setting a color resist, the ambient light of a specific color is irradiated to the ambient sensor 103 through the color resist, so as to ensure that the ambient sensor 103 can sense the ambient light intensity of the specific color, and then can adjust the brightness and white balance of the screen according to the brightness and color of the ambient light, to further improve the visual effect while saving power. In addition, since the light-transmitting color of the color resist in the present disclosure is the same as the light-emitting color of the first light-emitting device 102 below the color resist, the color resist hardly affects the light emitting effect of the first light-emitting device 102.

In some embodiments, in the above-mentioned display substrate provided by the embodiments of the present disclosure, the color resist will reduce the energy of the light received by the camera module to a certain extent. Therefore, considering the photosensitive effect of the ambient sensor 103 and the camera module comprehensively, it can be set that the orthographic projection of the color resist on the base substrate 101 approximately coincides with the orthographic projection of the corresponding ambient sensor 103 on the base substrate 101.

It should be understood that "approximately" in the present disclosure specifically refers to, limited by factors such as equipment and manufacturing process, the orthographic projection of the color resist on the base substrate 101 and the orthographic projection of the corresponding ambient sensor 103 on the base substrate 101 may be exactly coincident or slightly deviated, so as long as they are overlapping relationships within an allowable error range, they all fall within the scope of the present disclosure.

In some embodiments, in the above-mentioned display substrate provided by the embodiments of the present disclosure, as shown in FIG. 3, at least one row of the first light-emitting device 102 is spaced between adjacent two rows of the ambient sensors 103, and at least one column of the first light-emitting device 102 is spaced between adjacent two columns of the ambient sensors 103. The plurality of ambient sensors 103 evenly distributed in this way can sense the intensity of ambient light of a specific color in a balanced manner, and can ensure that the camera module receives light in a balanced manner. Certainly, during specific implementation, the positions of the plurality of ambient sensors 103 may also be set in other manners, as long as the ambient sensors 103 are uniformly distributed in the first display area AA1.

In some embodiments, in the above-mentioned display substrate provided by the embodiments of the present disclosure, as shown in FIG. 3 and FIG. 4, the light-emitting colors of the first light-emitting devices 102 in the same row may be the same, and the light-emitting colors of the first light-emitting devices 102 in adjacent rows may be different, which can identify the intensities of light with different colors.

In some embodiments, in the above-mentioned display substrate provided by the embodiments of the present disclosure, as shown in FIG. 3 to FIG. 6, each ambient sensor 103 may include a first transparent electrode 1031 and a second transparent electrode 1032. A layer where the first transparent electrode 1031 is located is between a layer where the second transparent electrode 1032 is located and the base substrate 101; and the first transparent electrodes 1031 of the ambient sensors 103 in a same row are electrically connected, and the second transparent electrodes 1032 of the ambient sensors 103 in at least one row are electrically connected.

Compared with the solution in which the first transparent electrodes 1031 and the second transparent electrodes 1032 of each ambient sensor 103 are relatively independent, in the present disclosure, the first transparent electrodes 1031 of each column of ambient sensors 103 are electrically connected, and the second transparent electrodes 1032 of at least one row of ambient sensors 103 are electrically connected, which can simplify wiring on the one hand, and increase the amount of collected signals on the other hand, thereby improving the accuracy of ambient light recognition. In addition, since the light-emitting colors of the first light-emitting devices 102 in the same row are the same, the light-transmitting colors of the color resists above the first light-emitting devices 102 in the same row are the same, so that the ambient sensor 103 under the first light-emitting devices 102 in the same row can sense the intensity of the light having the same color, and then adjust the brightness and white balance of the screen according to the brightness of the recognized light of the same color, which further improves the visual effect while saving power.

Figure 5:
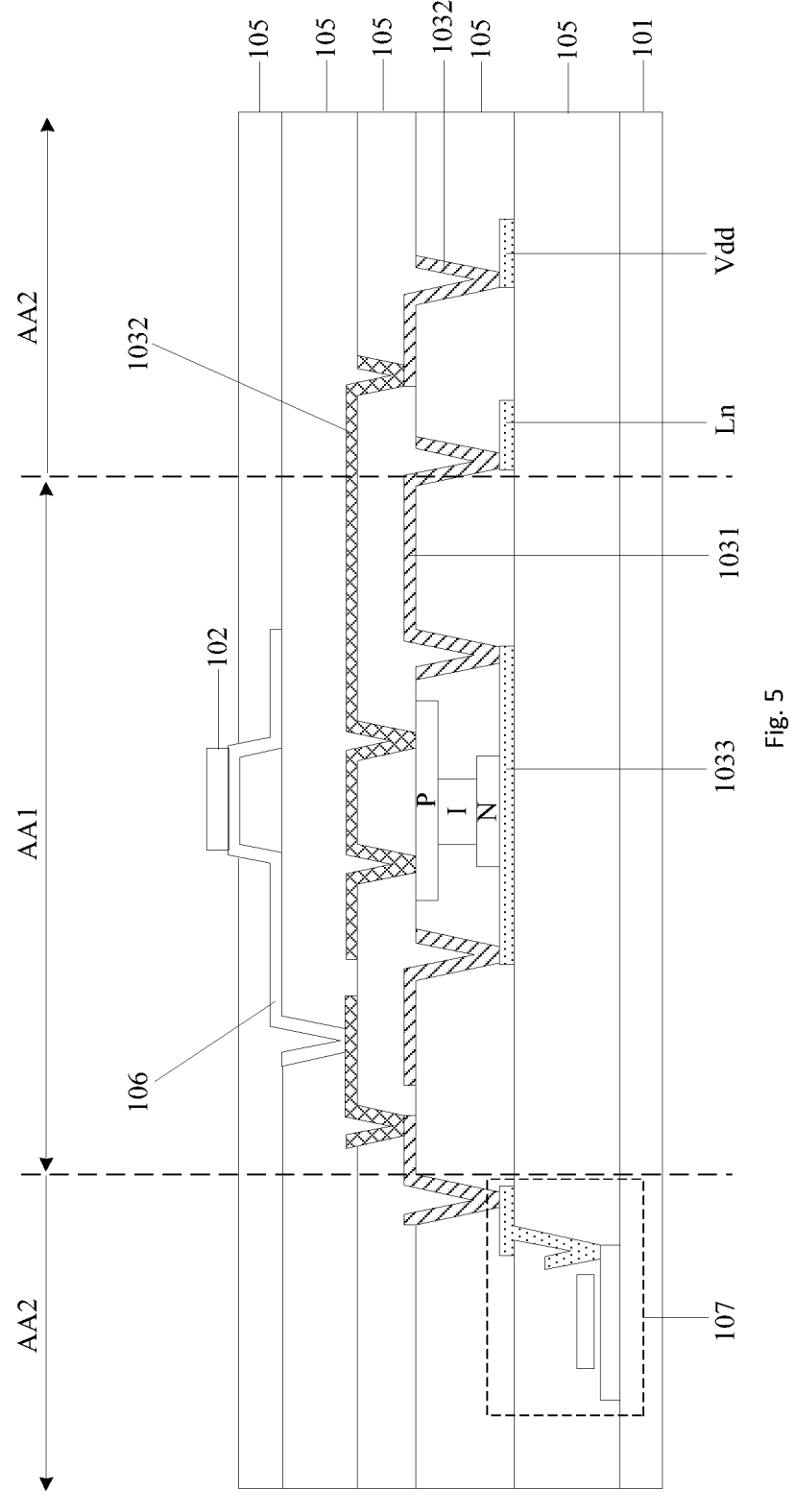
FIG. 5 is a sectional structure schematic diagram of an area D in FIG. 3 and FIG. 4.

In some embodiments, in the above-mentioned display substrate provided by the embodiments of the present disclosure, in order to facilitate the loading of a driving signal to the second transparent electrode 1032, as shown in FIG. 5 and FIG. 6, the display substrate may further include: a high-level signal line Vdd and an adaptor portion 1032'; the adaptor portion 1032' and the first transparent electrode 1031 are in the same layer and material, and a layer where the high-level signal line Vdd is located is between the layer where the first transparent electrode 1031 is located and the base substrate 101; the high-level signal line Vdd is electrically connected with the second transparent electrode 1032 through the adaptor portion 1032', the number of the adaptor portions 1032' is equal to the number of the high-level signal lines Vdd, and the second transparent electrodes 1032 of at least one row of the ambient sensors 103 are electrically connected with an adaptor portion 1032'.

In some embodiments, as shown in FIG. 3, the second transparent electrodes 1032 of the single-row ambient sensor 103 are electrically connected with an adaptor portion 1032', and the number of the high-level signal lines Vdd is the same as the number of the adaptor portions 1032', and both are equal to the total number of rows of ambient sensors 103, so that the second transparent electrodes 1032 of a single row of ambient sensors 103 can share a high-level signal line Vdd for power supply through an adaptor portion 1032'.

In some embodiments, as shown in FIG. 4, the second transparent electrodes 1032 of all ambient sensors 103 are electrically connected with the same adaptor portion 1032', and the number of high-level signal lines Vdd and the number of adaptor portions 1032' each are equal to 1, so that the second transparent electrodes 1032 of all the ambient sensors 103 can share a high-level signal line Vdd for power supply through the same adaptor portion 1032', so as to simplify the wiring design.

Figure 7:
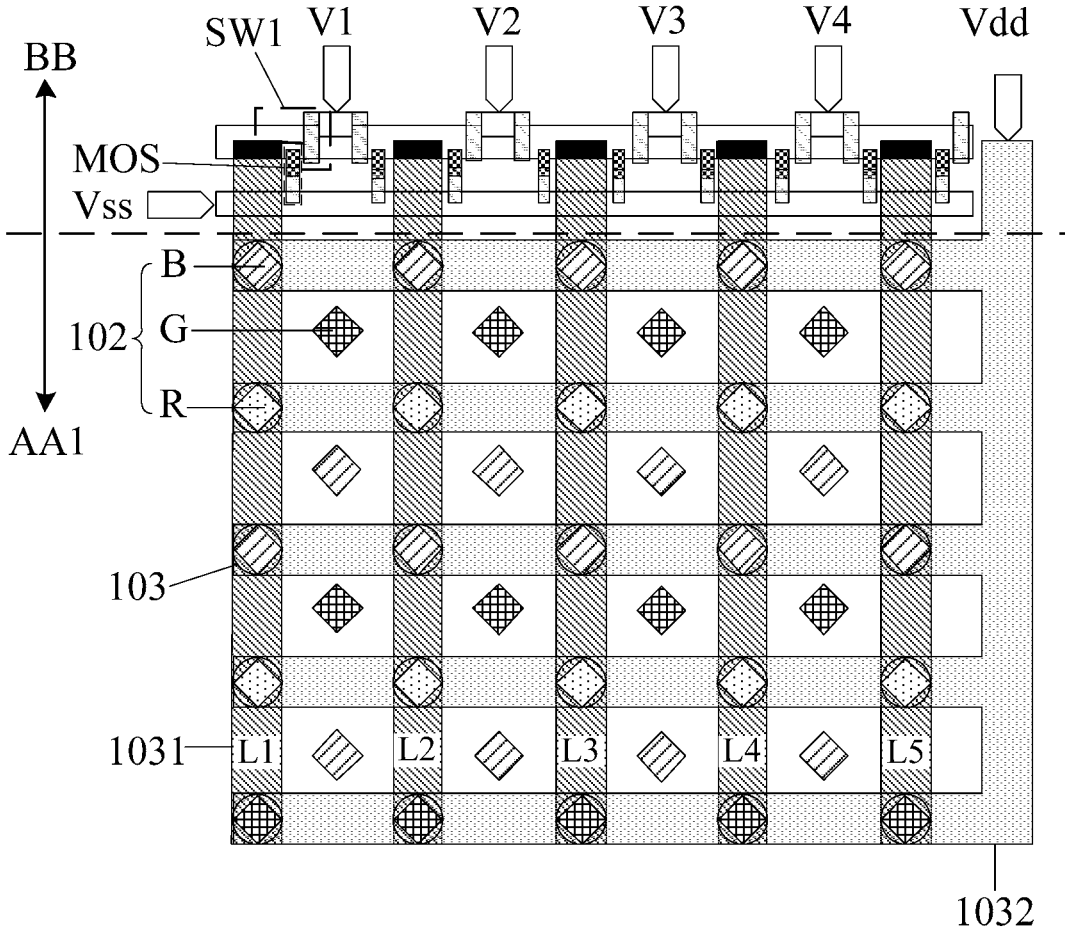
FIG. 7 is an enlarged structure schematic diagram of an area AA1 and an area BB adjacent to the area AA1 in FIG. 2.

In some embodiments, the display substrate provided in the embodiments of the present disclosure, as shown in FIG. 7, the display substrate may further include: a plurality of first switch transistors SW1, a plurality of field effect transistors MOS, a low-level signal line Vss, and a plurality of first control signal lines (not shown in the figure); where, a gate of each first switch transistor SW1 is electrically connected with a corresponding first control signal line, and a gate of the field effect transistor MOS is configured to be loaded with a fixed voltage; and two first switch transistors SW1 and two field effect transistors MOS are arranged between the ambient sensor 103 in the $i^{th}$ column and the ambient sensor 103 in the $(i+1)^{th}$ column, and the two first switch transistors SW1 are connected in series between the first transparent electrode 1031 of the ambient sensor 103 in the $i^{th}$ column and the first transparent electrode 1031 of the ambient sensor 103 in the $(i+1)^{th}$ column, one of the two field effect transistors MOS is connected in series between the first transparent electrode 1031 of the ambient sensor 103 in the $i^{th}$ column and the low-level signal line Vss, the other of the two field effect transistors MOS is connected in series between the first transparent electrode 1031 of the ambient sensor 103 in the $(i+1)^{th}$ column and the low-level signal line Vss, where i is an integer greater than or equal to 1 and less than m, and m is the total number of columns of the ambient sensors 103.

In the process of sensing ambient light through the ambient sensor 103, there may be background noise (for example, water droplets on the screen may cause inaccurate ambient light intensity sensing), and the existence of the color resist causes a higher photoelectric sensing amount of the ambient sensor 103. Therefore, the acquired signal can be made measurable after noise reduction by the differential algorithm.

In some embodiments, electrical signals of the ambient sensor 103 in the first column or the ambient sensor 103 in the $m^{th}$ column may be pre-stored, then the first switch transistor SW1 is controlled to time-divisionally collect electrical signals V1, V2, V3, V4, etc., between two adjacent columns of ambient sensors 103, and the time-divisionally collected electrical signals V1, V2, V3, V4, etc., may be compared with each other to eliminate the electrical signal with large fluctuation (such as V4), and an average value of the electrical signals of the ambient sensor in each column is determined according to the remaining electrical signals (such as V1, V2, V3, etc.), and the pre-stored electrical signals of the ambient sensor in the first column or the ambient sensor in the $m^{th}$ column. The average value of the electrical signals of the ambient sensor in each column is the detected ambient light brightness.

Taking a pre-stored electrical signal $V_{L1}$ of the ambient sensor 103 in the first column and a total of five columns of ambient sensors 103 as an example, the time-divisionally collected electrical signals are as followings: an electrical signal $V1=|V_{L1}-V_{L2}|$ between the ambient sensor 103 in the first column and the ambient sensor 103 in the second column, an electrical signal $V2=|V_{L2}-V_{L3}|$ between the ambient sensor 103 in the second column and the ambient sensor 103 in the third column, an electrical signal $V3=|V_{L3}-V_{L4}|$ between the ambient sensor 103 in the third column and the ambient sensor 103 in the fourth column, and an electrical signal $V4=|V_{L4}-V_{L5}|$ between the ambient sensor 103 in the fourth column and the ambient sensor 103 in the fifth column; since the number of ambient sensors 103 in the same column is the same, the manufacturing process is the same, and the environment is the same, theoretically, V1, V2, V3, and V4 are of the same size. Therefore, by comparing V1, V2, V3, and V4 with each other, if V4 fluctuates greatly, it means that there is noise at the ambient sensor 103 in the fourth column and the ambient sensor 103 in the fifth column associated with V4, then V4 is removed, and only V1, V2 and V3 are used to calculate an average value of the electrical signals of the ambient sensors in the three columns, the average value of the electrical signals of the three columns of ambient sensors can accurately represent the detected ambient light brightness. Through the above process, the brightness of the ambient light can be effectively identified.

It should be noted that when collecting the electrical signal between the ambient sensor 103 in the $i^{th}$ column and the ambient sensor 103 in the $(i+1)^{th}$ column, the first control signal line is used to control the first switch transistor SW1 between the ambient sensor 103 in the $i^{th}$ column and the ambient sensor 103 in the $(i+1)^{th}$ column to be in an on state, and to control the other first switch transistors SW1 to be in an off state.

Figure 8:
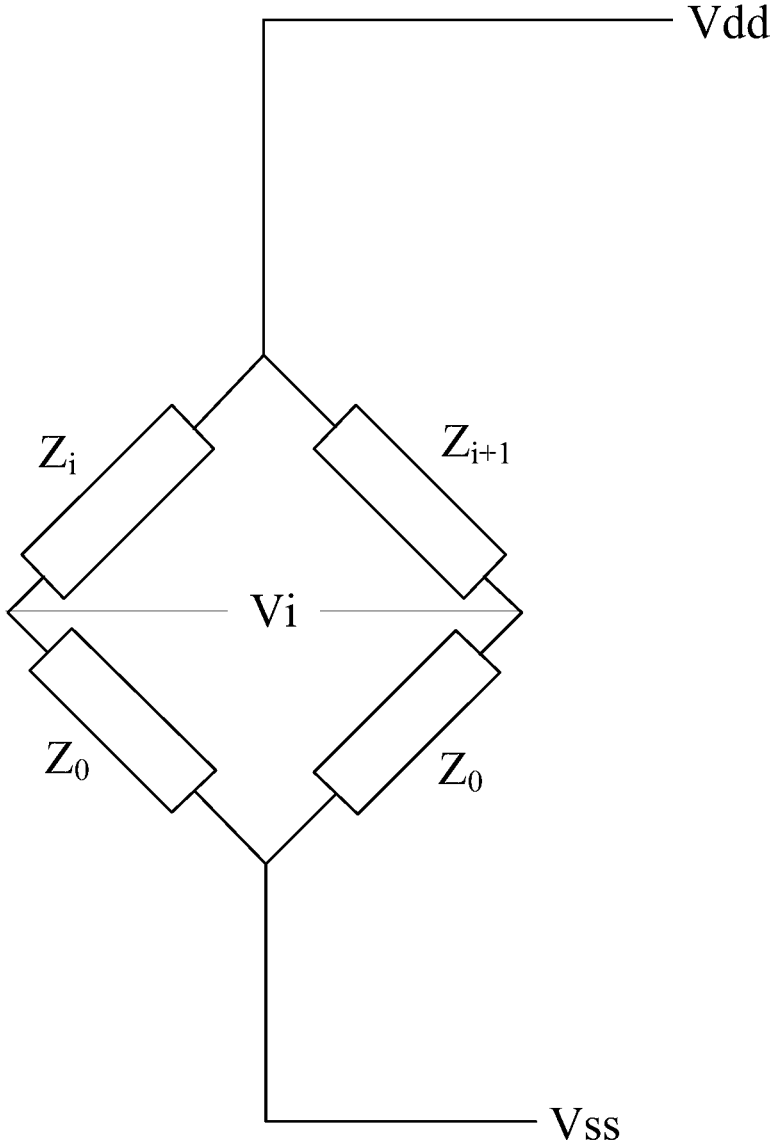
FIG. 8 is an equivalent circuit diagram of collecting electrical signals between columns of ambient sensors in FIG. 7.

When collecting the voltage Vi between the ambient sensor 103 in the $i^{th}$ column and the ambient sensor 103 in the $(i+1)^{th}$ column, the corresponding equivalent circuit is shown in FIG. 8, where $Z_i$ and $Z_{i+1}$ are impedances of the ambient sensor 103 in the $i^{th}$ column and the ambient sensor 103 in the $(i+1)^{th}$ column, respectively; $Z_0$ is an impedance of the field effect transistor MOS between the ambient sensor 103 in the $i^{th}$ column and the ambient sensor 103 in the $(i+1)^{th}$ column. According to the bridge principle, it can be obtained:

$$Vi = \frac{(Vdd - Vss) * Z_0 * (Z_{i+1} - Z_i)}{(Z_0 + Z_{i+1}) * (Z_0 + Z_i)}.$$

Since $Z_{i+1}$ and $Z_i$ are small values, the existence of Vdd-Vss and $Z_0$ can make the collected voltage Vi more observable.

In addition, the difference between the fixed voltage loaded on the gate of the field effect transistor MOS and the low-level signal provided by the low-level signal line Vss should ensure that the field effect transistor MOS works in the linear region, so that the impedance $Z_0$ of the field effect transistor MOS is adjustable, and the field effect transistor MOS is equivalent to a resistor with adjustable impedance at this time.

Figure 9:
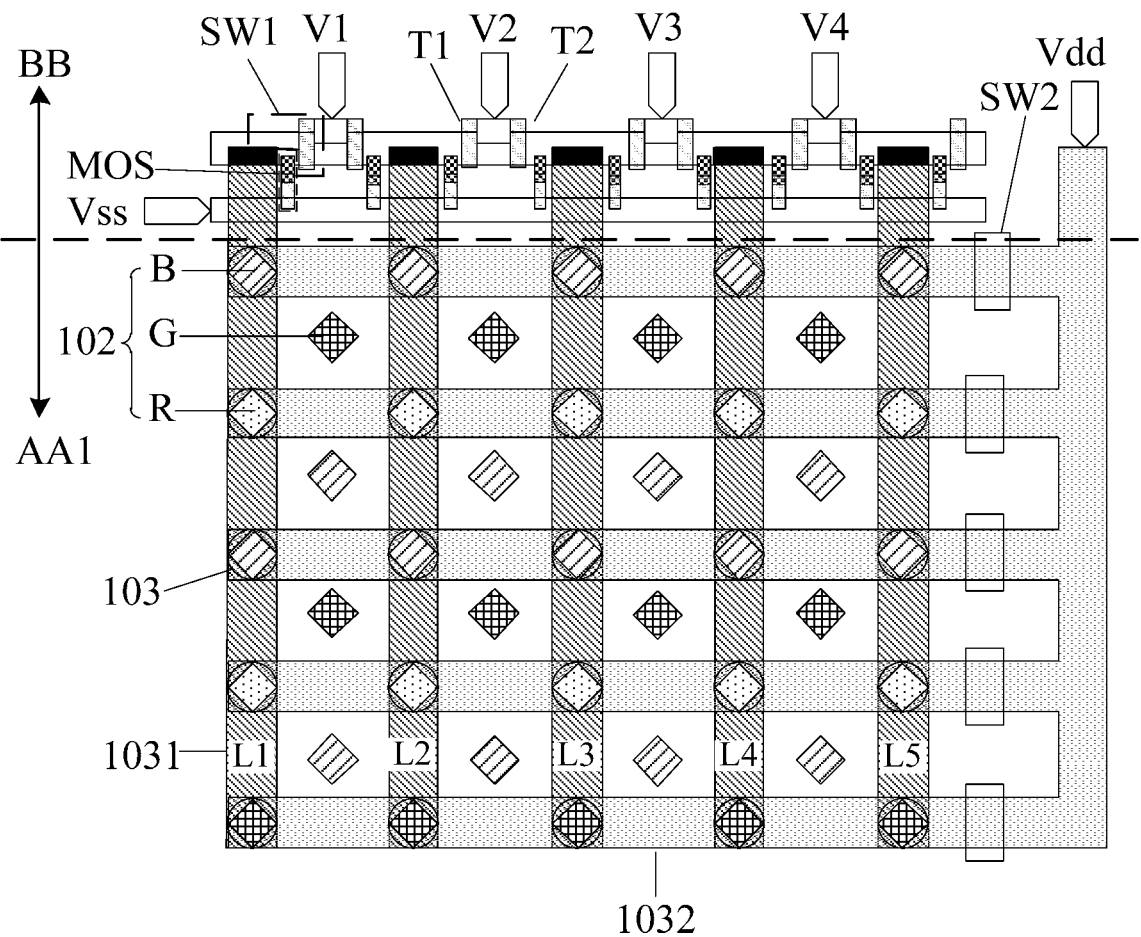
FIG. 9 is another enlarged structure schematic diagram of an area AA1 and an area BB adjacent to the area AA1 in FIG. 2.

In some embodiments, the above-mentioned display substrate provided by the embodiments of the present disclosure, as shown in FIG. 9, may further include: a plurality of second switch transistors SW2 and a plurality of second control signal lines (not shown in the figure); and a gate of each second switch transistor SW2 may be electrically connected with one of the second control signal lines, and each second switch transistor SW2 is connected in series between the high-level signal line Vdd and a row of ambient sensors 103.

In some embodiments, part of the second switch transistors SW2 can be controlled to be in an on state through the second control signal line, and the remaining second switch transistors SW2 are in an off state, and light-emitting colors of the first light-emitting devices 102 corresponding to each row of ambient sensors 103 electrically connected with the second switch transistors SW2 in the on state are a same color, so that the ambient sensor 103 can identify the intensities of light of different colors in the ambient light.

For example, in FIG. 9, the first second switch transistor SW2 and the third second switch transistor SW2 from top to bottom can be controlled to be in an on state through the second control signal line, and the remaining second switch transistors SW2 are in an off state, so that the high-level signal line Vdd provides a high-level signal for the ambient sensor 103 under the blue light device B through the turned-on second switch transistor SW2, and the ambient sensor 103 under the blue light device B can receive blue light transmitted by the blue resist, and convert the blue light into an electrical signal for identifying the blue light intensity. Through the above process, the brightness of different colors of light in the ambient light can be effectively identified.

In some embodiments, in the above-mentioned display substrate provided by the embodiments of the present disclosure, as shown in FIG. 5 and FIG. 6, the ambient sensor 103 may further include a P-type semiconductor layer and an N-type semiconductor layer which are stacked, or include a P-type semiconductor layer, an intrinsic semiconductor layer I, and an N-type semiconductor layer which are stacked (as shown in FIG. 4). The N-type semiconductor layer can be electrically connected with the first transparent electrode 1031, and the P-type semiconductor layer can be electrically connected with the second transparent electrode 1032; and the low-level signal line Vss may be in the same layer as the P-type semiconductor layer, and the material of the low-level signal line Vss is the material of the conductive P-type semiconductor layer.

By making the low-level signal line Vss with the material of the conductive P-type semiconductor layer, it is avoided to separately set the film layer of the low-level signal line Vss, which can reduce one mask process and one film layer, which is conducive to the realization of the product with thin and light design.

In some embodiments, in the above-mentioned display substrate provided by the embodiments of the present disclosure, as shown in FIG. 5 and FIG. 6, the first control signal line and the second control signal line are in the same layer and of the same material as the gate of the first switch transistor SW1 and the gate of the second switch transistor SW2; and the high-level signal line Vdd is in the same layer as the source and drain of the first switch transistor SW1 and the source and drain of the second switch transistor SW2, and the material of the high-level signal line Vdd may be a high temperature resistant material such as aluminum alloy or molybdenum metal, etc.; the materials of the source and drain of the first switch transistor SW1 and the source and drain of the second switch transistor SW2 may include a first titanium metal layer, an aluminum metal layer and a second titanium metal layer that are stacked.

By setting the first control signal line, the second control signal line and the gate of the first switch transistor SW1 and the gate of the second switch transistor SW2 in the same layer and material, it is not necessary to separately set film layers for the first control signal line and the second control signal line, the number of masks is reduced, the cost is saved, and the number of film layers is reduced, which is beneficial to realize the design of light and thin products. In addition, by placing the high-level signal line Vdd on the same layer as the source and drain of the first switch transistor SW1 and the source and drain of the second switch transistor SW2, the number of film layers can be reduced, which is beneficial to realize the design of light and thin products.

Figure 2:
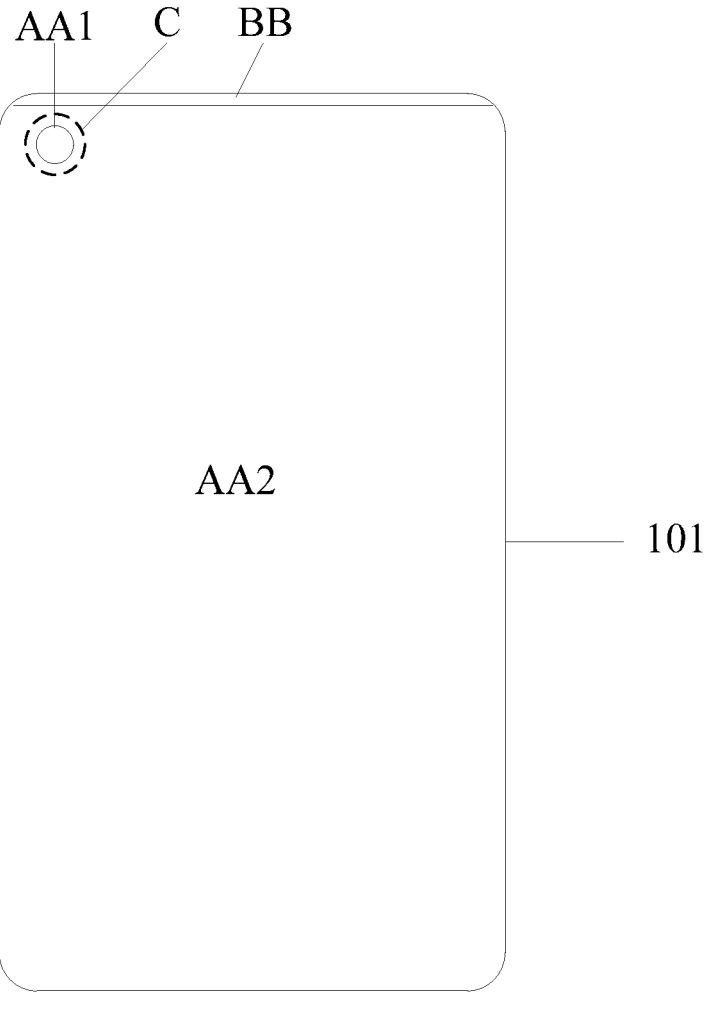
FIG. 2 is a schematic structural diagram of a display device according to an embodiment of the present disclosure.

In some embodiments, the above-mentioned display substrate provided by the embodiments of the present disclosure, as shown in FIG. 2, FIG. 7 and FIG. 9, may further include: a border area BB adjacent to the first display area AA1, where a plurality of first switch transistors SW1, a plurality of first control signal lines, a plurality of second switch transistors SW2, a plurality of field effect transistors MOS, a low-level signal line Vss and a plurality of second control signal lines may be arranged in the border area BB.

In the related art, electronic components are arranged at the end of the whole machine, so as to drive the ambient sensor 103 to work through the electronic components, and collect electrical signals output from the ambient sensor 103. In the present disclosure, the electronic components, such as the plurality of first switch transistors SW1, the plurality of first control signal lines, the plurality of second switch transistors SW2, the plurality of field effect transistors MOS, the low-level signal line Vss and the plurality of second control signal lines, etc., are arranged in the border area BB, which increases the integration of the products.

In some embodiments, in the above-mentioned display substrate provided by the embodiments of the present disclosure, as shown in FIG. 5 and FIG. 6, each ambient sensor 103 may further include: a connection portion 1033 arranged below the N-type semiconductor layer, the first transparent electrodes 1031 adjacent to each column of ambient sensors 103 may be electrically connected through the connection portions 1033, so as to collect electrical signals of the ambient sensors 103 in the same column.

In some embodiments, the connection portion 1033 may be in the same layer as the source and drain of the first switch transistor SW1 and the source and drain of the second switch transistor SW2, and the material of the connection portion 1033 may be aluminum alloy or molybdenum metal. By placing the connection portion 1033 in the same layer as the source and drain of the first switch transistor SW1 and the source and drain of the second switch transistor SW2, the number of film layers can be reduced, which is beneficial to realize the design of light and thin products. In addition, because the manufacturing process temperature of the PIN structure or the PN structure in the ambient sensor 103 is relatively high, the related art generally adopts a stacked structure of the first titanium metal layer/aluminum metal layer/the second titanium metal layer including aluminum element to fabricate the source and drain, and the aluminum element is not resistant to high temperature. Therefore, in the present disclosure, high temperature resistant materials such as aluminum alloy or molybdenum metal are used to fabricate the connection portion 1033. In addition, since the impedance of aluminum alloy or molybdenum metal is relatively small, when high temperature resistant materials such as aluminum alloy or molybdenum metal are used to fabricate the connection portion 1033, the impedance on the path where each column of ambient sensors 103 is located can be effectively reduced, thereby benefiting to reduce the loss of the collected electrical signal Vi.

In some embodiments, as shown in FIG. 5 and FIG. 6, an organic insulating layer 105 may be provided to reduce a coupling capacitance between the first transparent electrode 1031 and the second transparent electrode 1032.

Figure 10:
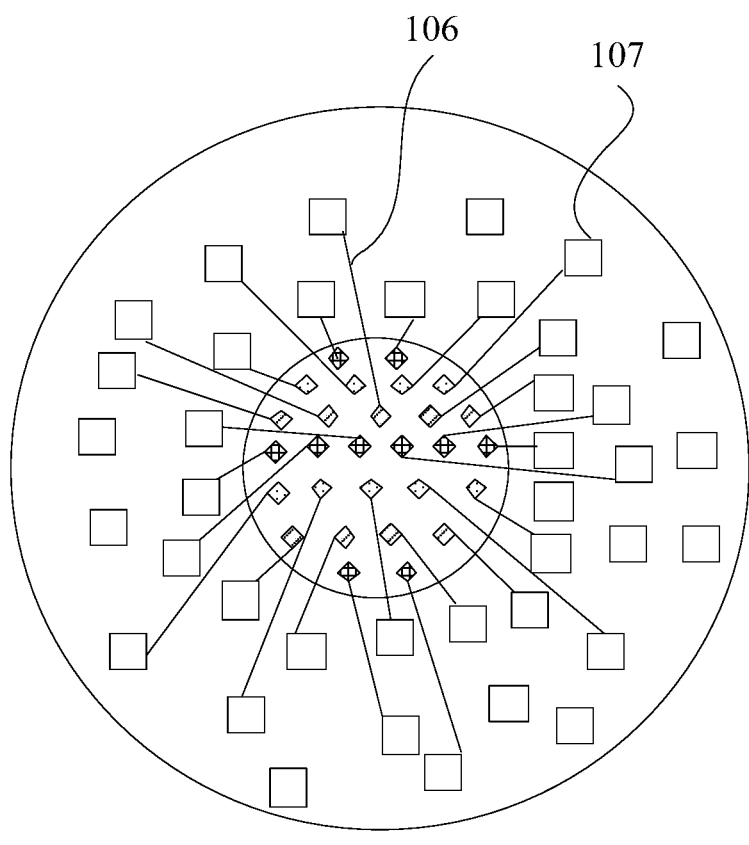
FIG. 10 is an enlarged schematic structural diagram of an implementation manner of an area C in FIG. 2.

In some embodiments, the above-mentioned display substrate provided by the embodiments of the present disclosure, as shown in FIG. 5, FIG. 6, and FIG. 10, may further include: a plurality of transparent wirings 106 between the base substrate 101 and a layer where a plurality of light-emitting devices are located (i.e., a layer where the first light-emitting devices 102 are located), and a plurality of pixel driving circuits 107 between the base substrate 101 and a layer where a plurality of transparent wirings 106 are located. The plurality of transparent wirings 106 are connected between the plurality of pixel driving circuits 107 and the plurality of first light-emitting devices 102, and the plurality of transparent wirings 106 may be arranged in the same layer as the first transparent electrodes 1031 and/or the second transparent electrodes 1032.

In some embodiments, FIG. 5 and FIG. 6 show a plurality of transparent wirings 106 with a total of three layers of wirings, and the three layers of wirings are respectively located at the layer where the first transparent electrode 1031 is located, the layer where the second transparent electrode 1032 is located, and one side of the layer where the second transparent electrode 1032 is located, facing away from the base substrate 101. The three layers of wirings make it possible to provide more transparent wirings 106 within a certain size range to drive more first light-emitting devices 102 and ensure the display resolution (PPI) of the first display area AA1 and the PPI of the second display area AA2 to be the same, which improves the overall display effect.

Based on the same inventive concept, embodiments of the present disclosure further provide a display device including the above-mentioned display substrate provided by embodiments of the present disclosure. Since the principle of solving the problem of the display device is similar to the principle of solving the problem of the above-mentioned display substrate, the implementations of the display device provided by the embodiments of the present disclosure may refer to the implementations of the above-mentioned display substrate provided by the embodiments of the present disclosure, which are not repeated herein.

In some embodiments, the display device may be any product or component with a display function, such as a mobile phone, a tablet computer, a television, a display, a notebook computer, a digital photo frame, a navigator, a smart watch, a fitness wristband, a personal digital assistant, etc. The display device includes but is not limited to: a radio frequency unit, a network module, an audio output unit, an input unit, a sensor, a display unit, a user input unit, an interface unit, a memory, a processor, and a power supply and other components. Those skilled in the art can understand that the structure of the above-mentioned display device does not constitute a limitation on the display device, and the display device may include more or less components described above, or combine some components, or arrange different components.

Based on the same inventive concept, embodiments of the present disclosure further provide a method for driving the above-mentioned display substrate, which may include the following operations:

in a non-light-emitting stage, detecting ambient light brightness by an ambient sensor; automatically adjusting screen brightness according to the detected ambient light brightness and a preset function relationship between ambient light brightness and screen brightness; and in a light-emitting stage, driving a light-emitting device to emit light for screen display.

By detecting the brightness of the ambient light in the non-light-emitting stage, the interference of the brightness of the screen itself is avoided, and the accuracy of the detection of the brightness of the ambient light is improved.

In some embodiments, the picture display process includes a data signal writing stage and a light-emitting stage: in the data signal writing stage, the light-emitting device is turned off to present a black screen; in the light-emitting stage, the light-emitting device is turned on to present a color screen. In view of this, the non-light-emitting stage in the present disclosure may be the data signal writing stage. In addition, in some embodiments, a frame of black picture may be inserted between two frames of normal display pictures, and one frame time of the black picture may be used as the non-light-emitting stage.

In some embodiments, in the above-mentioned driving method provided by the embodiments of the present disclosure, before the operation of in the non-light-emitting stage, detecting the ambient light brightness by the ambient sensor, the following operations may further be performed:

controlling at least one second switch transistor to be in an on state through a second control signal line, and controlling the other second switch transistors to be in an off state, where light-emitting colors of the first light-emitting devices corresponding to each row of ambient sensors electrically connected with the second switch transistors in the on state are a same color, to identify the intensity of a specific color of light through the ambient sensors.

In some embodiments, in the above-mentioned driving method provided by the embodiments of the present disclosure, the operation of detecting the ambient light brightness by the ambient sensor, includes:

controlling two first switch transistors between the ambient sensor in the $i^{th}$ column and the ambient sensor in the $(i+1)^{th}$ column to be in an on state through the first control signal line, and controlling remaining first switch transistors to be in an off state, loading a low-level signal on the low-level signal line, and loading a fixed voltage on gates of two field effect transistors MOS between the ambient sensor in the $i^{th}$ column and the ambient sensor in the $(i+1)^{th}$ column at a same time, to read multiple electrical signals between the ambient sensor in the $i^{th}$ column and the ambient sensor in the $(i+1)^{th}$ column by time-sharing; and comparing the multiple electrical signals read by time-sharing, eliminating the electrical signal with large fluctuations, and determining an average value of the electrical signals of the ambient sensors in each column according to the remaining electrical signals and the pre-stored electrical signals of the ambient sensor in the first column or the ambient sensor in the $m^{th}$ column. The average value of the electrical signals of the ambient sensors in each column is the detected ambient light brightness.

It should be noted that, since the principle of solving the problem of the driving method is similar to the principle of solving the problem of the above-mentioned display substrate, the implementations of the driving method provided by the embodiments of the present disclosure may refer to the implementations of the above-mentioned display substrate provided by the embodiments of the present disclosure, which are not repeated herein.

Obviously, those skilled in the art can make various changes and modifications to the embodiments of the present disclosure without departing from the spirit and scope of the embodiments of the present disclosure. Thus, provided that these modifications and variations of the embodiments of the present disclosure fall within the scope of the claims of the present disclosure and their equivalents, the present disclosure is also intended to include such modifications and variations.

What is claimed is:

1. A display substrate, comprising:

a base substrate, comprising a first display area, and a second display area located at least on one side of the first display area, wherein a camera module is installed in the first display area;

a plurality of light-emitting devices, arranged in an array on the base substrate, wherein the plurality of light-emitting devices comprise: a plurality of first light-emitting devices in the first display area, and a plurality of second light-emitting devices in the second display area, and a density of the plurality of first light-emitting devices in the first display area is less than or equal to a density of the plurality of second light-emitting devices in the second display area; and a plurality of ambient sensors, arranged between a layer where the plurality of light-emitting devices are located and the base substrate, wherein the plurality of ambient sensors are in the first display area, and the plurality of ambient sensors are below at least part of the first light-emitting devices, and an orthographic projection of an ambient sensor of the plurality of ambient sensors on the base substrate completely and entirely covers an orthographic projection of a corresponding first light-emitting device of the plurality of light-emitting devices on the base substrate; and the orthographic projection of the ambient sensor of the plurality of ambient sensors on the base substrate is larger than the orthographic projection of the corresponding first light-emitting device of the plurality of light-emitting devices on the base substrate wherein each of the plurality of ambient sensors comprises a first transparent electrode and a second transparent electrode, and a layer where the first transparent electrode is located is between a layer where the second transparent electrode is located and the base substrate; and first transparent electrodes of ambient sensors of the plurality of ambient sensors in a same row are electrically connected, and second transparent electrodes of ambient sensors of the plurality of ambient sensors in at least one row are electrically connected.

2. The display substrate according to claim 1, wherein a distance, between a boundary of the orthographic projection of the ambient sensor on the base substrate and a boundary of the orthographic projection of the corresponding first light-emitting device on the base substrate, ranges from 2 μm to 3 μm.

3. The display substrate according to claim 1, further comprising:

a color filter layer, arranged on a side, facing away from the base substrate, of the layer where the plurality of light-emitting devices are located;

wherein the color filter layer comprises a plurality of color resists, each of the plurality of color resists and one ambient sensor are arranged correspondingly, and a light-transmitting color of the each color resist is the same as a light-emitting color of a first light-emitting device above a corresponding ambient sensor.

4. The display substrate according to claim 3, wherein an orthographic projection of the color resist on the base substrate approximately coincides with an orthographic projection of the corresponding ambient sensor on the base substrate.

5. The display substrate according to claim 1, wherein at least one row of the plurality of first light-emitting devices is spaced between adjacent two rows of the plurality of ambient sensors, and at least one column of the plurality of first light-emitting devices is spaced between adjacent two columns of the plurality of ambient sensors.

6. The display substrate according to claim 5, wherein light-emitting colors of first light-emitting devices of the plurality of first light-emitting devices in a same row are same, and light-emitting colors of first light-emitting devices of the plurality of first light-emitting devices in adjacent rows are different.

7. The display substrate according to claim 1, further comprising: a high-level signal line and an adaptor portion;

wherein the adaptor portion is arranged in a same layer and material as the first transparent electrode, and a layer where the high-level signal line is located is between the layer where the first transparent electrode is located and the base substrate; and the high-level signal line is electrically connected with the second transparent electrode through the adaptor portion, a number of adaptor portions is equal to a number of high-level signal lines, and second transparent electrodes of at least one row of the plurality of ambient sensors are electrically connected with one of the adaptor portions.

8. The display substrate according to claim 7, wherein second transparent electrodes of ambient sensors of the plurality of ambient sensors in a same row are electrically connected with one of the adaptor portions; and the number of the high-level signal lines is same as the number of the adaptor portions, which is equal to a total number of rows of the plurality of ambient sensors.

9. The display substrate according to claim 7, wherein second transparent electrodes of all the plurality of ambient sensors are electrically connected with a same adaptor portion, and the number of high-level signal lines and the number of the adaptor portions each are equal to 1.

10. The display substrate according to claim 8, further comprising: a plurality of first switch transistors, a plurality of field effect transistors, a low-level signal line and a plurality of first control signal lines;

a gate of each of the plurality of first switch transistors is electrically connected with one of the plurality of first control signal lines, and a gate of the plurality of field effect transistor is configured to be loaded with a fixed voltage; and two of the plurality of first switch transistors and two of the plurality of field effect transistors are between an ambient sensor in an ith column and an ambient sensor in an (i+1)th column;

the two first switch transistors are connected in series between the first transparent electrode of the ambient sensor in the ith column and the first transparent electrode of the ambient sensor in the (i+1)th column; and one of the two field effect transistors is connected in series between the first transparent electrode of the ambient sensor in the ith column and the low-level signal line, and the other of the two field effect transistors is connected in series between the first transparent electrode of the ambient sensor in the (i+1)th column and the low-level signal line;

wherein i is an integer greater than or equal to 1 and less than m, and m is a total number of columns of the ambient sensors.

11. The display substrate according to claim 10, further comprising: a plurality of second switch transistors and a plurality of second control signal lines;

wherein a gate of each of the plurality of second switch transistors is electrically connected with one of the plurality of second control signal lines; and each of the plurality of second switch transistors is connected in series between the high-level signal line and one row of the plurality of ambient sensors.

12. The display substrate according to claim 11, wherein each ambient sensor of the plurality of ambient sensors further comprises: a P-type semiconductor layer and an N-type semiconductor layer arranged in stacked, or each ambient sensor further comprises: the P-type semiconductor layer, an intrinsic semiconductor layer, and the N-type semiconductor layer arranged in stacked;

the N-type semiconductor layer is electrically connected with the first transparent electrode, and the P-type semiconductor layer is electrically connected with the second transparent electrode; and the low-level signal line is in a same layer as the P-type semiconductor layer, and a material of the low-level signal line is a material of a conductive P-type semiconductor layer.

13. The display substrate according to claim 11, wherein a first control signal line of the plurality of first control signal lines and a second control signal line of the plurality of second control signal lines are in a same layer and of a same material as a gate of a first switch transistor of the plurality of first switch transistors and a gate of a second switch transistor of the plurality of second switch transistors; and the high-level signal line is in a same layer as a source and drain of the first switch transistor and a source and drain of the second switch transistor;

a material of the high-level signal line is aluminum alloy or molybdenum metal; and the source and drain of the first switch transistor and the source and drain of the second switch transistor comprise a first titanium metal layer, an aluminum metal layer and a second titanium metal layer arranged in stacked.

14. The display substrate according to claim 11, further comprising: a border area adjacent to the first display area, wherein the plurality of first switch transistors, the plurality of first control signal lines, the plurality of second switch transistors, the plurality of field effect transistors, the low-level signal line and the plurality of second control signal lines are located in the border area.

15. The display substrate according to claim 12, wherein each of the plurality of ambient sensors further comprises: a connection portion arranged below the N-type semiconductor layer, and adjacent first transparent electrodes of the plurality of ambient sensors in a same column are electrically connected through the connection portion.

16. The display substrate according to claim 15, wherein the connection portion is in a same layer as the source and drain of the first switch transistor and the source and drain of the second switch transistor; and a material of the connection portion is aluminum alloy or molybdenum metal.

17. The display substrate according to claim 1, further comprising:

a plurality of transparent wirings between the base substrate and the layer where the plurality of light-emitting devices are located; and a plurality of pixel driving circuits between the base substrate and a layer where the plurality of transparent wirings are located;

wherein the plurality of transparent wirings are connected between the plurality of pixel driving circuits and the plurality of first light-emitting devices, and the plurality of transparent wirings are arranged in a same layer as the first transparent electrode and/or the second transparent electrode.

18. A display device, comprising the display substrate according to claim 1.

19. A method for driving the display substrate according to claim 1, comprising:

in a non-light-emitting stage, detecting ambient light brightness via an ambient sensor of the plurality of ambient sensors;

automatically adjusting screen brightness according to the detected ambient light brightness and a preset function relationship between ambient light brightness and screen brightness; and in a light-emitting stage, driving a light-emitting device of the plurality of light-emitting devices to emit light for screen display.

* * * * *